(12) United States Patent
Lim et al.

(10) Patent No.: US 8,641,298 B2
(45) Date of Patent: Feb. 4, 2014

(54) MULTI-CHANNEL OPTICAL MODULE

(75) Inventors: Kwon-Seob Lim, Gwangju (KR); Hyun Seo Kang, Gwangju (KR); Jong Jin Lee, Gwangju (KR); Seihyoung Lee, Gwangju (KR); Jai Sang Koh, Gwangju (KR)

(73) Assignee: Electronics and Telecommunications Research Institute, Daejeon (KR)

( * ) Notice: Subject to any disclaimer, the term of this patent is extended or adjusted under 35 U.S.C. 154(b) by 137 days.

(21) Appl. No.: 13/300,859

(22) Filed: Nov. 21, 2011

(65) Prior Publication Data

US 2012/0128295 A1 May 24, 2012

(30) Foreign Application Priority Data

Nov. 22, 2010 (KR) ........................ 10-2010-0116333

(51) Int. Cl.
*G02B 6/36* (2006.01)

(52) U.S. Cl.
USPC ............................................. 385/92; 385/14

(58) Field of Classification Search
None
See application file for complete search history.

(56) References Cited

U.S. PATENT DOCUMENTS

| | | | | |
|---|---|---|---|---|
| 4,767,171 A * | 8/1988 | Keil et al. | ........................ | 385/35 |
| 5,552,918 A * | 9/1996 | Krug et al. | ..................... | 398/139 |
| 5,663,821 A * | 9/1997 | Suda et al. | ..................... | 398/139 |
| 6,731,882 B1 * | 5/2004 | Althaus et al. | ................ | 398/139 |
| 6,954,592 B2 * | 10/2005 | Tan et al. | ....................... | 398/138 |
| 7,070,340 B2 * | 7/2006 | Crane et al. | ..................... | 385/92 |
| 7,088,518 B2 * | 8/2006 | Tatum et al. | .................. | 359/634 |
| 7,272,323 B2 | 9/2007 | Grann et al. | | |
| 7,336,905 B2 * | 2/2008 | Pyo et al. | ....................... | 398/138 |
| 7,438,480 B2 * | 10/2008 | Okada et al. | .................... | 385/88 |
| 7,450,858 B2 * | 11/2008 | Verdiell | ........................ | 398/164 |
| 8,160,451 B2 * | 4/2012 | Liu et al. | ........................ | 398/138 |
| 2003/0152336 A1 * | 8/2003 | Gurevich et al. | ............... | 385/88 |
| 2003/0215240 A1 | 11/2003 | Grann et al. | | |
| 2004/0146304 A1 * | 7/2004 | Kuhara et al. | .................. | 398/138 |
| 2006/0072867 A1 * | 4/2006 | Kawagishi | ........................ | 385/4 |
| 2006/0088255 A1 * | 4/2006 | Wu et al. | ......................... | 385/92 |
| 2007/0269167 A1 | 11/2007 | Tamura et al. | | |
| 2009/0129415 A1 * | 5/2009 | Li et al. | ...................... | 372/38.01 |
| 2009/0310920 A1 * | 12/2009 | Kim et al. | ........................ | 385/88 |

* cited by examiner

*Primary Examiner* — Charlie Peng
(74) *Attorney, Agent, or Firm* — William Park & Associates Patent Ltd.

(57) ABSTRACT

The present inventive concept herein relates to multi-channel optical modules, and more particularly, to a multi-channel optical module capable of processing a plurality of signals having different optical wavelengths. The multi-channel optical module may include a stem including one or more cavities; at least one lead pin formed in one or more cavities; a plurality of optical devices formed in the one or more cavities; and a filter portion forming an optical path between the plurality of optical devices and an optical fiber by separating a plurality of optical signals according to a wavelength. According to the inventive concept, processing capacity of the optical module may be improved. Also, according to the inventive concept, electrical and optical cross talk of the optical module may be reduced.

20 Claims, 14 Drawing Sheets

MULTI-CHANNEL OPTICAL MODULE

CROSS-REFERENCE TO RELATED APPLICATIONS

This U.S. non-provisional patent application claims priority under 35 U.S.C. §119 of Korean Patent Application No. 10-2010-0116333, filed on Nov. 22, 2010, the entire contents of which are hereby incorporated by reference.

BACKGROUND

The present inventive concept herein relates to multi-channel optical modules, and more particularly, to a multi-channel optical module capable of processing a plurality of signals having different optical wavelengths.

As data traffic on the internet explosively increases, demands for high speed data transmission system such as gigabit Ethernet are increasing. To satisfy those demands, a study of providing a plurality of data through one optical fiber using a conventional WDM (wavelength division multiplexing) technique is being performed.

An optical diplexer transceiver module for two-way data communication uses two signals having different optical wavelengths for two-way data communication. One of the two signals is used to process an up-stream signal and the other is used to process a down-stream signal.

FIG. 1 is a drawing illustrating a general optical diplexer. Referring to FIG. 1, the optical diplexer uses two signals having different optical wavelengths to provide two-way data communication. A signal having an optical wavelength of $\lambda 1$ may be used for a down-stream data communication and a signal having an optical wavelength of $\lambda 2$ may be used for an up-stream data communication. Two optical modules are used to process the two signals. One optical module processes a signal having an optical wavelength of $\lambda 1$ and the other module processes a signal having an optical wavelength of $\lambda 2$.

In case of a cable television, a video signal is additionally used besides the up-stream and down-stream data. Thus, an optical triplexer module for processing three signals is required.

FIG. 2 is a drawing illustrating a general optical triplexer. Referring to FIG. 2, the optical triplexer uses three signals having different optical wavelengths to provide two-way data communication and a video service. A signal having an optical wavelength of $\lambda 1$ may be used for a down-stream data communication, a signal having an optical wavelength of $\lambda 2$ may be used for an up-stream data communication and a signal having an optical wavelength of $\lambda 3$ may be used for a video service.

Three optical modules are used to process three signals. Each of the optical modules processes an optical signal having a different wavelength. Consequently, as a data capacity to be processed increases, a quantity of optical wavelength to be used also increases. That is, if one service is added, one optical wavelength is additionally required to process the corresponding service. As a quantity of optical wavelength increases, a quantity of optical module required also increases. Thus, an optical module is required that has a simple structure and can process a lot of optical wavelengths.

SUMMARY

Embodiments of the inventive concept provide a multi-channel optical module. The multi-channel optical module may include a stem including one or more cavities; a plurality of lead pins formed in one or more cavities; a plurality of optical devices formed in the one or more cavities; and a filter portion forming an optical path between the plurality of optical devices and an optical fiber by separating a plurality of optical signals according to a wavelength.

BRIEF DESCRIPTION OF THE FIGURES

The foregoing and other features and advantages of the invention will be apparent from the more particular description of preferred aspects of the invention, as illustrated in the accompanying drawings in which like reference characters refer to the same parts throughout the different views. The drawings are not necessarily to scale, emphasis instead being placed upon illustrating the principles of the invention. In the drawings, the thickness of layers and regions are exaggerated for clarity.

DETAILED DESCRIPTION OF THE EMBODIMENTS

Preferred embodiments of the inventive concept will be described below in more detail with reference to the accompanying drawings. The embodiments of the inventive concept may, however, be embodied in different forms and should not be constructed as limited to the embodiments set forth herein. Rather, these embodiments are provided so that this disclosure will be thorough and complete, and will fully convey the scope of the inventive concept to those skilled in the art. Like numbers refer to like elements throughout.

Figure 1:
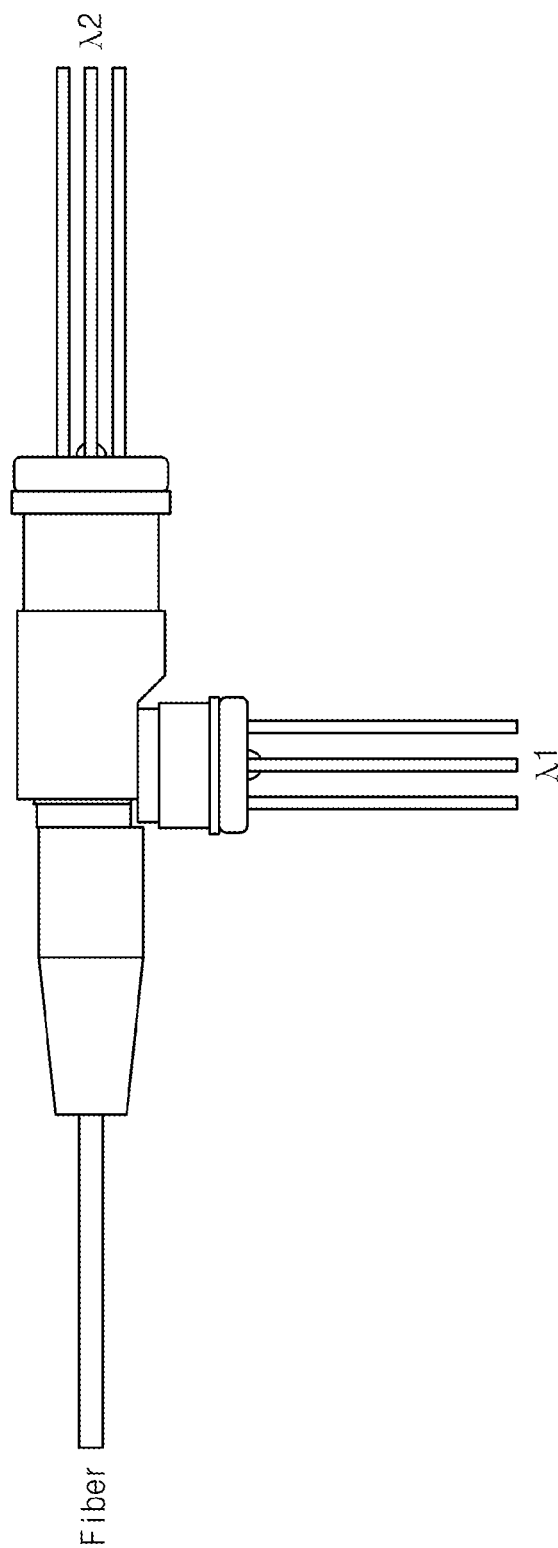
FIG. 1 is a drawing illustrating a general optical diplexer.
Figure 2:
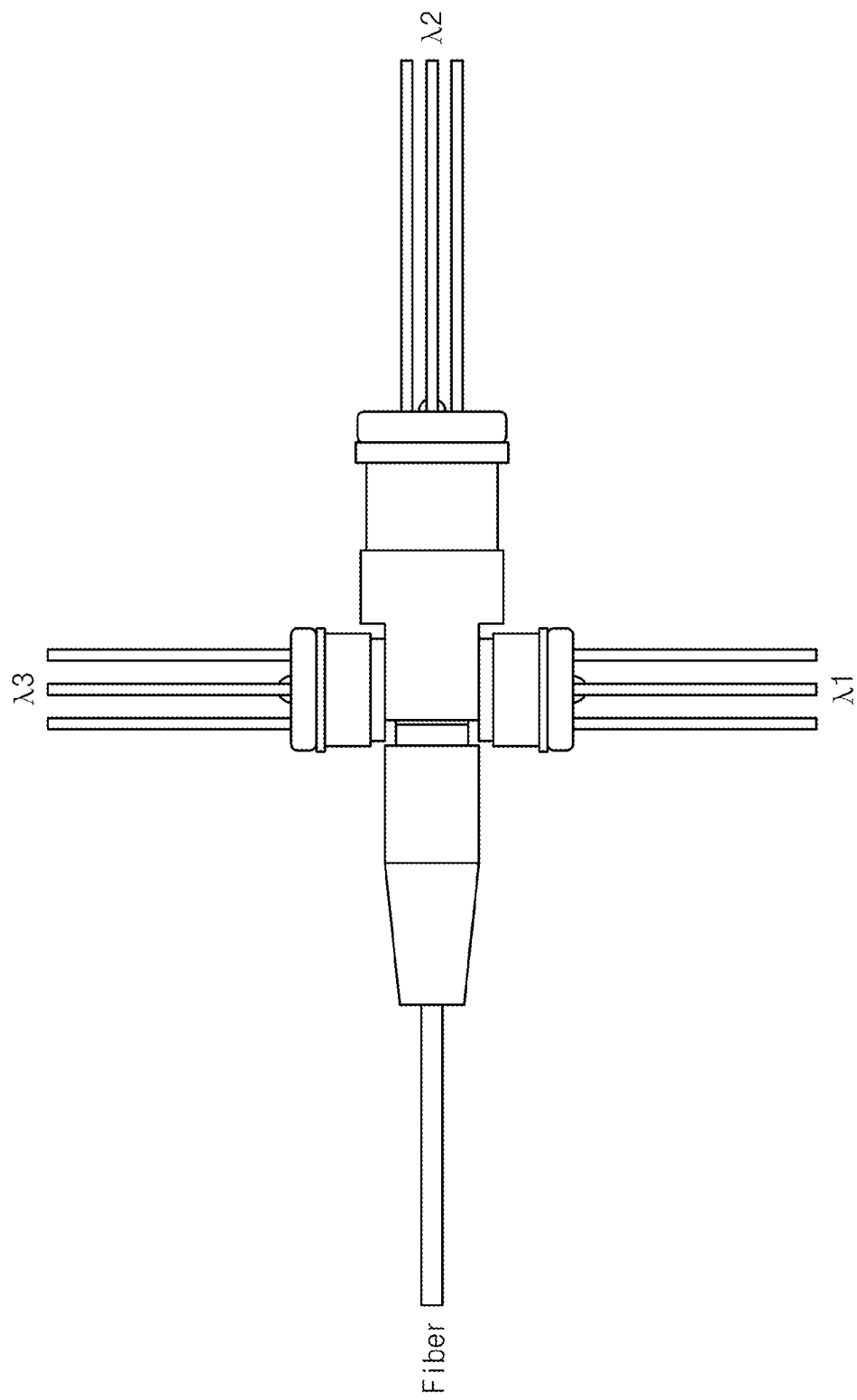
FIG. 2 is a drawing illustrating a general optical triplexer.
Figure 3:
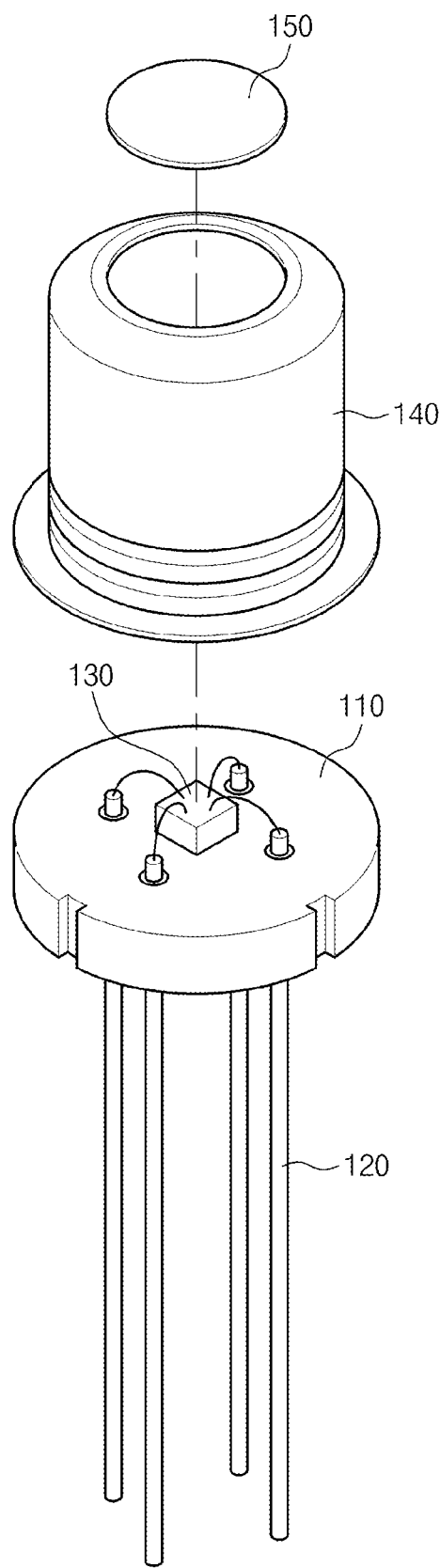
FIG. 3 is a drawing illustrating a general optical module of TO-CAN type.

FIG. 3 is a drawing illustrating a general optical module of TO-CAN type. Referring to FIG. 3, the general optical module of TO-CAN type includes a stem 110, a lead 120, an optical device 130, a lens cap 140 and a lens 150.

The optical device 130 is mounted on the stem 110. The optical device is electrically connected to the outside through the lead 120. Also, the optical device 130 is optically connected to the outside through the lens 150. The lens cap 140 is combined with the stem 110 to cover the optical device 130. The lens 150 is set in the lens cap 140 to form an optical path between the optical device 130 and an optical fiber. If the optical device 130 is a light emitting device, the optical device 130 converts an electrical signal into an optical signal. If the optical device 130 is a light receiving device, the optical device 130 converts an optical signal into an electrical signal. An electrical signal may be transmitted to an external data processing system through the lead 120.

Figure 4:
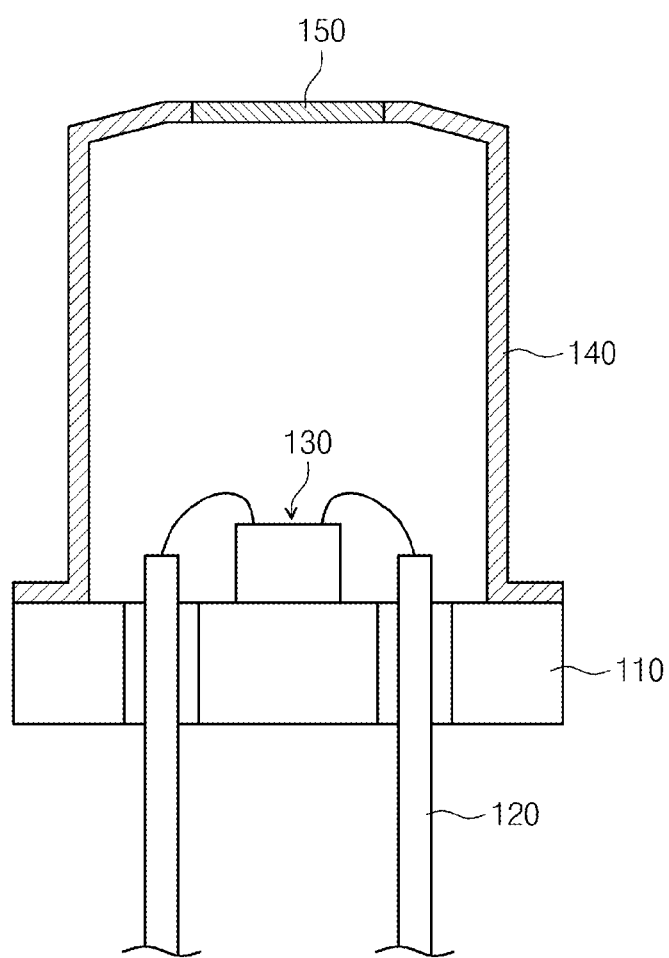
FIG. 4 is a drawing illustrating the optical module of TO-CAN type of FIG. 3 in detail.

FIG. 4 is a drawing illustrating the optical module of TO-CAN type of FIG. 3 in detail. Referring to FIG. 4, a general optical module of TO-CAN type includes a stem 110, a lead 120, an optical device 130, a lens cap 140 and a lens 150.

The optical device 130 is set on the stem 110. The optical device 130 set on one side of the stem 110 is protected by the lens cap 140. The lens cap 140 is combined with one side of the stem 110 and the lens 150 optically aligned with the optical device 130 is set on the center of the lens cap 140. The lead 120 penetrates the stem 110 to extend to the outside.

As described above, in a general optical module, only one optical device is set on one stem. Thus, a general optical module can process one optical wavelength. A plurality of optical modules is required to process a plurality of optical wavelengths.

Figure 5:
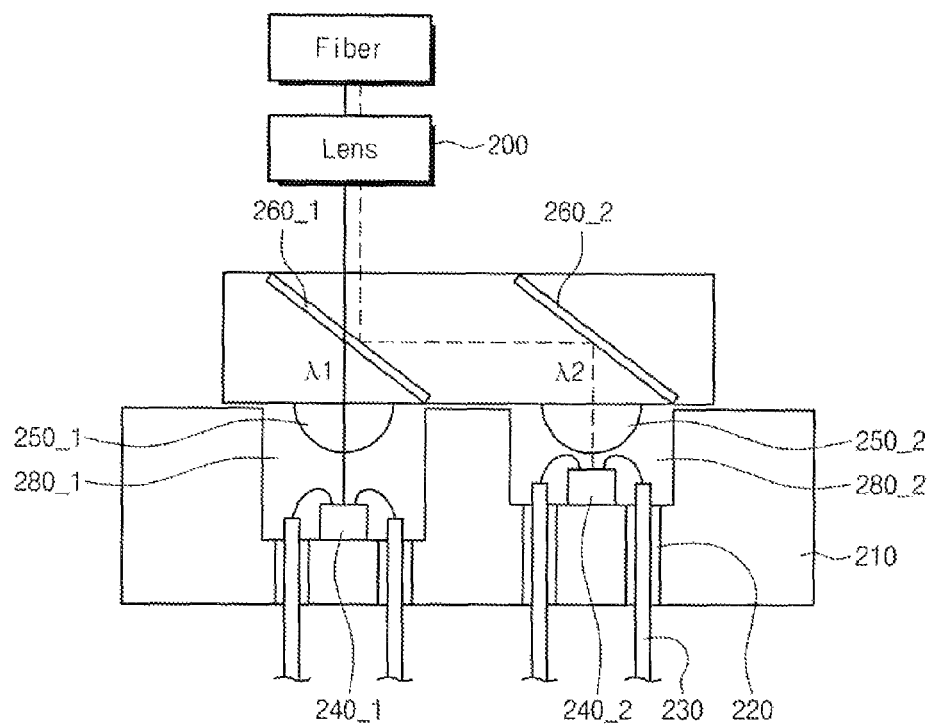
FIG. 5 is a drawing illustrating an optical module in accordance with the inventive concept.

FIG. 5 is a drawing illustrating an optical module in accordance with the inventive concept. Referring to FIG. 5, the optical module in accordance with the inventive concept includes a stem 210, a plurality of insulating layer λ20, a plurality of lead λ30, first and second optical devices 240_1 and 240_2, first and second lenses 250_1 and 250_2 and first and second filters 260_1 and 260_2. The optical module may further include a lens 200 for coupling optical signals of a plurality of wavelengths being transmitted to an optical fiber.

In the present inventive concept, the two optical devices 240_1 and 240_2 are formed in cavities 280_1 and 280_2 inside the stem 210 respectively. One or more cavities may be formed inside the stem 210. The optical devices 240_1 and 240_2 may be a light emitting device or a light receiving device. For example, one light emitting device and one light receiving device may be formed in the stem 210 so that an optical module transmits data and receives data. Two light emitting devices may be formed in the stem 210 so that an optical module performs data transmission using two wavelengths. Two light receiving devices may be formed in the stem 210 so that an optical module performs data reception using two wavelengths.

In the embodiment of the inventive concept, two optical devices 240_1 and 240_2 are formed in the stem 210 but the inventive concept is not limited thereto. That is, in a multi-channel optical module, two or more optical devices may be formed in one stem. Also, optical signals having two or more wavelengths may be used to perform data transmission and data reception.

The optical device 240_1 and 240_2 may be connected to the outside through the lead λ30. The lenses 250_1 and 250_2 transmit an optical signal from an optical fiber to a light receiving device or transmit an optical signal from a light emitting device to an optical fiber. For example, if the first optical device 240_1 is a light receiving device, the first lens 250_1 transmits an optical signal from an optical fiber to the first optical device 240_1. If the first optical device 240_1 is a light emitting device, the first lens 250_1 transmits an optical signal from the first optical device 240_1 to an optical fiber.

As an illustration, it is assumed that the first optical device 240_1 is a light receiving device and the second optical device 240_2 is a light emitting device. Among optical signals from an optical fiber, the first filter 260_1 passes an optical signal having a wavelength of λ1 and reflects an optical signal having a wavelength of λ2. The passed optical signal having a wavelength of λ1 is transmitted to the first lens 250_1. The first lens 250_1 transmits the optical signal having a wavelength of λ1 to the first optical device 240_1. The first optical device 240_1 converts the optical signal having a wavelength of λ1 into an electrical signal. The converted electrical signal is transmitted to the outside through the lead λ30.

An electrical signal from the lead λ30 is converted into an optical signal having a wavelength of λ2 by the second optical device 240_2. The optical signal having a wavelength of λ2 is reflected by the second filter 260_2. The optical signal having a wavelength of λ2 reflected by the second filter 260_2 is reflected by the first filter 260_1. The optical signal having a wavelength of reflected by the first filter 260_1 is transmitted to an optical fiber. Consequently, the first optical device 240_1 processes an optical signal having a wavelength of λ1 and the second optical device 240_2 processes an optical signal having a wavelength of λ2.

An optical path of optical signal having a wavelength of λ1 may be different from an optical path of optical signal having a wavelength of λ2. If optical paths are different from each other, a problem may occur in an optical alignment. Thus, in the present embodiment, optical paths may be coincided with each other by controlling diameters of the first and second lens 250_1 and 250_2. Furthermore, the poor optical coupling efficiency caused by the difference of optical paths can be resolved by controlling the height of cavity of the stem.

As described above, one optical module can process data using two wavelengths by forming two optical devices in one stem. That is, one optical module can process a plurality of optical wavelengths. Also, electrical and optical cross talk may be minimized by forming the lead λ30 and mounting the optical devices in the cavity inside the stem 210. To reduce electrical cross talk more, a bottom surface of the filter may be coated with metal except portions which an optical signal passes by. Lengths of a bonding wire and a lead line may be minimized by forming a lead in the cavity of the stem. As a result, a high speed signal transmission may be made possible.

Figure 6:
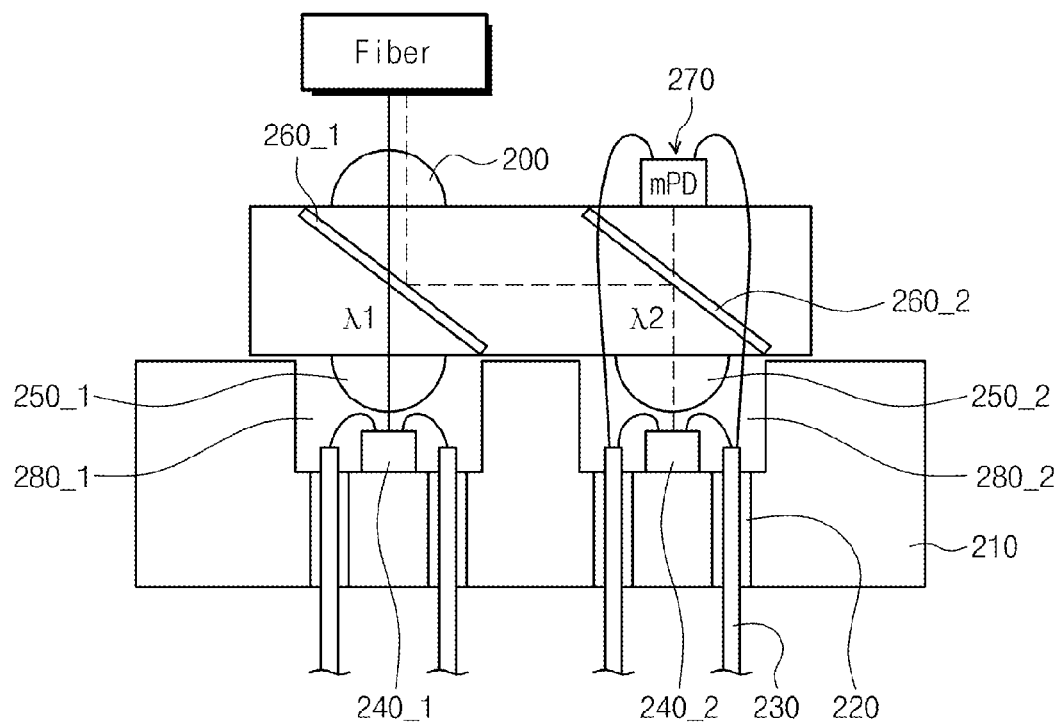
FIGS. 6 through 13 are drawings illustrating some other embodiments of optical module in accordance with the inventive concept.

FIG. 6 is a drawing illustrating other embodiment of optical module in accordance with the inventive concept. Referring to FIG. 6, the optical module in accordance with the inventive concept includes a stem 210 in which cavities 280_1 and 280_2 are formed, an insulating layer λ20, a lead λ30, first and second optical devices 240_1 and 240_2, first and second lens 250_1 and 250_2, first and second filters 260_1 and 260_2 and a monitoring device 270. In the optical module of the inventive concept, a lens 200 for collecting optical signals having a plurality of wavelengths may be further mounted.

Operations of elements except the monitoring device 270 were already described with reference to FIG. 5. Thus, hereinafter, only an operation of the monitoring device will be described. Also, it is assumed that the second optical device 240_2 is a light emitting device.

The monitoring device 270 is used to maintain a constant output of light emitting device. The monitoring device 270 detects an output of optical signal output from the second optical device 250_2. The monitoring device 270 may control outputs of the first and second optical devices 240_1 and 240_2 according to an output of optical signal. For example, when an output of the second optical device 240_2 is weak, the monitoring device 270 may control the second optical device 240_2 so that an output of the second optical device 240_2 increases. When an output of the second optical device 240_2 is strong, the monitoring device 270 may control the second optical device 240_2 so that an output of the second optical device 240_2 decreases. Also, when an output of the optical signal is weak, the monitoring device 270 may control the first and second optical devices 240_1 and 240_2 so that outputs of the first and second optical devices 240_1 and 240_2 increase at the same time. When an output of the optical signal is strong, the monitoring device 270 may control the first and second optical devices 240_1 and 240_2 so that outputs of the first and second optical devices 240_1 and 240_2 decrease at the same time.

To perform the operation described above, the second filter 260_2 is required to transmit a part of optical signals from the second optical device 240_2 to the monitoring device 270. As described above, the monitoring device 270 monitors an output of the optical device and thereby the optical device can stably output an optical signal.

Figure 7:
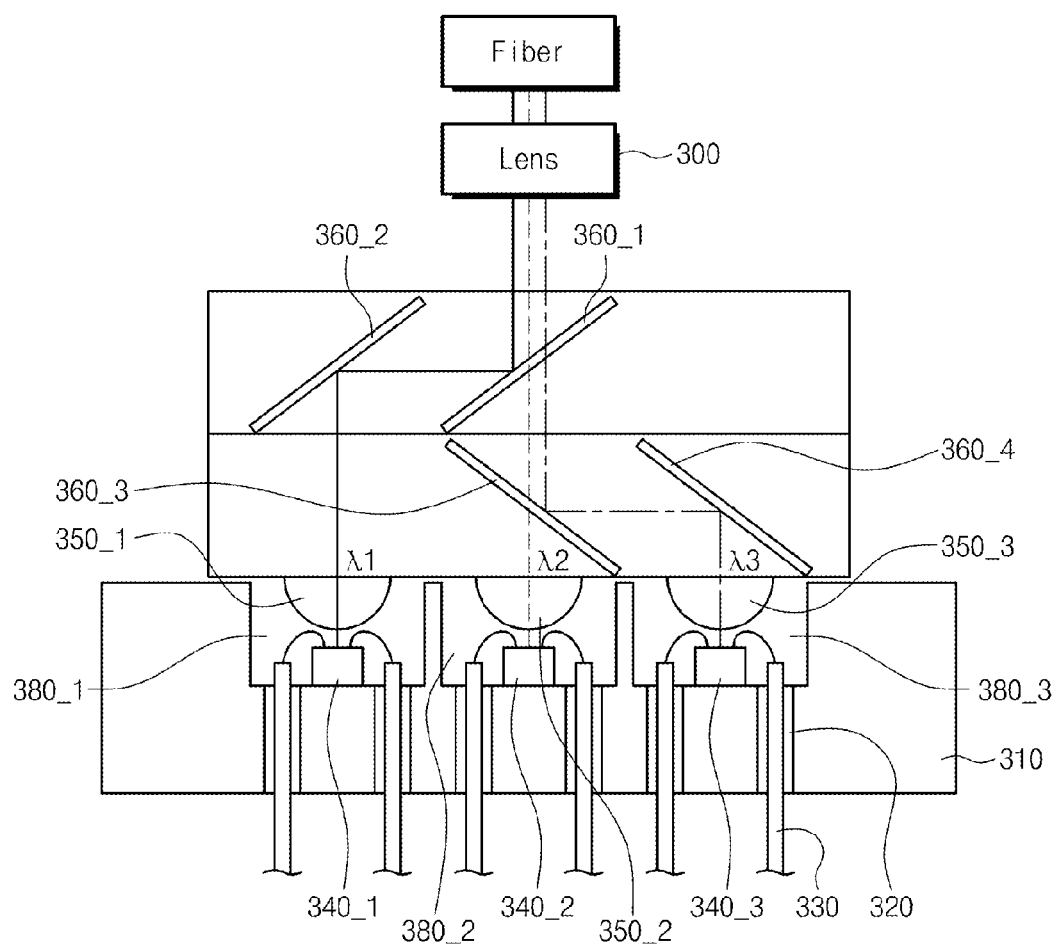

FIG. 7 is a drawing illustrating other embodiment of optical module in accordance with the inventive concept. Referring to FIG. 7, the optical module in accordance with the inventive concept includes a stem 310, an insulating layer 320, a lead 330, first, second and third optical devices 340_1, 340_2 and 340_3, first, second and third lenses 350_1, 350_2 and 350_3 and first through fourth filters 360_1 through 360_4. In the optical module, a lens 300 for collecting optical signals having a plurality of wavelengths being transmitted to an optical fiber may be additionally mounted.

In the present inventive concept, three optical devices 340_1, 340_2 and 340_3 are formed in cavities 380_1, 380_2 and 380_3 inside the stem 310. One or more cavities may be formed in one stem 310. The lead 330 is provided to each of the cavities 380_1, 380_2 and 380_3 to electrically connect the optical devices 340_1, 340_2 and 340_3 to the outside. The optical device may be a light emitting device or a light receiving device. For example, two light emitting devices and one light receiving device may be formed in the stem 310 so that the optical module performs data transmission of two channels and data reception of one channel. Also, three light emitting devices may be formed in the stem 310 so that the optical module performs data transmission using three wavelengths.

The optical device is connected to the outside through the lead 330. The insulating layer 320 insulates the lead and the stem 310. The lens transmits an optical signal from an optical fiber to a light receiving device or transmits an optical signal from a light emitting device to an optical fiber.

As an illustration, it is assumed that the first and second optical devices 340_1 and 340_2 are light receiving devices and the third optical device 340_3 is a light emitting device. Among optical signals from an optical fiber, the first filter 360_1 reflects an optical signal having a wavelength of $\lambda 1$ and passes an optical signal having a wavelength of $\lambda 2$. The reflected optical signal having a wavelength of $\lambda 1$ is transmitted to the second filter 360_2. The second filter 360_2 reflects the optical signal having a wavelength of $\lambda 1$. The reflected optical signal having a wavelength of $\lambda 1$ reflected by the second filter 360_2 is transmitted to the first optical device 340_1. The first optical device 340_1 converts the optical signal having a wavelength of $\lambda 1$ into an electrical signal. The converted electrical signal is transmitted to the outside through the lead 330.

The third filter 360_3 passes an optical signal having a wavelength of $\lambda 2$ and reflects an optical signal having a wavelength of $\lambda 3$. The optical signal having a wavelength of $\lambda 2$ which passed through the third filter 360_3 is transmitted to the second optical device 340_2. The second optical device 340_2 converts the optical signal having a wavelength of $\lambda 2$ into an electrical signal. The converted signal is transmitted to the outside through the lead 330.

The electrical signal from the lead 330 is converted into an optical signal having a wavelength of $\lambda 3$ by the third optical device 340_3. The optical signal having a wavelength of $\lambda 3$ is reflected by the fourth filter 360_4. The optical signal having a wavelength of $\lambda 3$ reflected by the fourth filter 360_4 is reflected by the third filter 360_3. The optical signal having a wavelength of $\lambda 3$ reflected by the third filter 360-3 passes through the first filter 360-1. The optical signal having a wavelength of $\lambda 3$ that passed through the first filter 360-1 is transmitted to an optical fiber.

Consequently, the first optical device 340_1 receives an optical signal having a wavelength of $\lambda 1$, the second optical device 340_2 receives an optical signal having a wavelength of $\lambda 2$ and the third optical device 340_3 transmits an optical signal having a wavelength of $\lambda 3$.

As described above, one stem 310 can perform data processing using three wavelengths by forming three optical devices 340_1, 340_2 and 340_3 in one stem 310. That is, one optical module can process a plurality of optical wavelengths.

Figure 8:
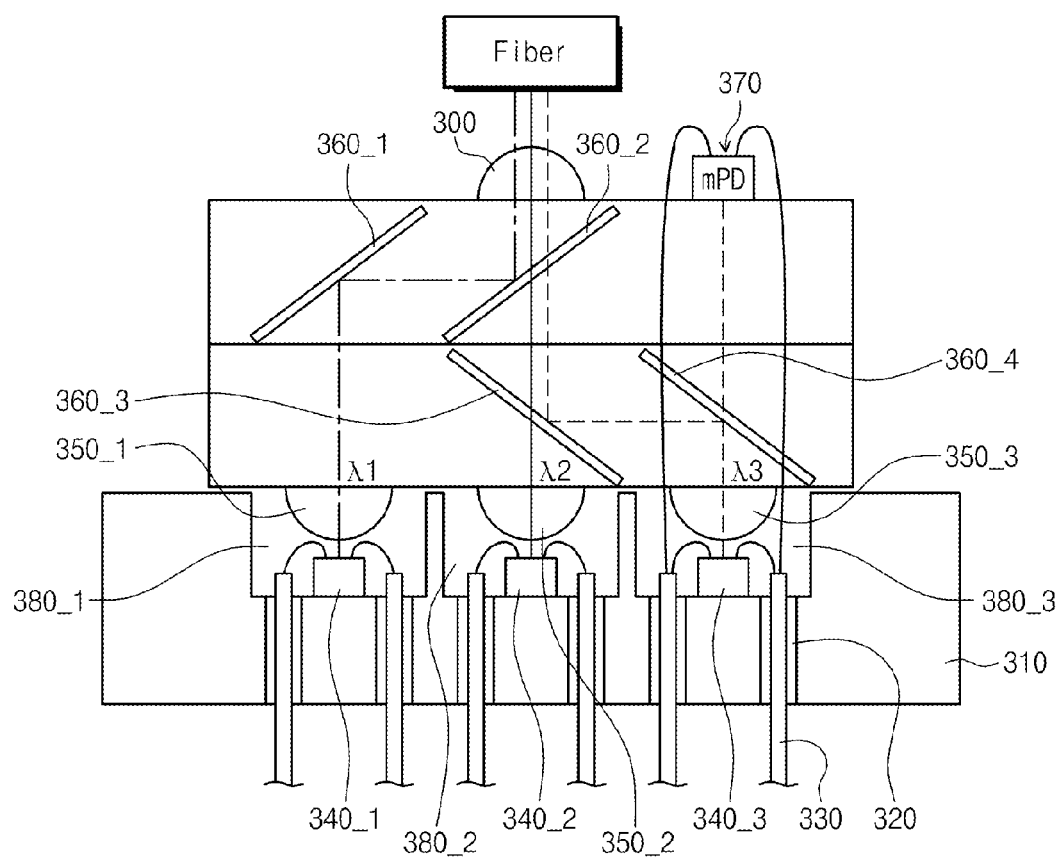

FIG. 8 is a drawing illustrating other embodiment of optical module in accordance with the inventive concept. Referring to FIG. 8, the optical module in accordance with the inventive concept includes a stem 310, an insulating layer 320, a lead 330, first, second and third optical devices 340_1, 340_2 and 340_3, first, second and third lenses 350_1, 350_2 and 350_3, first through fourth filters 360_1 through 360_4 and a monitoring device 370. In the optical module, a lens 300 for collecting optical signals having a plurality of wavelengths being transmitted to an optical fiber may be additionally mounted.

Operations of the elements except the monitoring device 370 were already described through FIG. 7. Thus, hereinafter, only an operation of the monitoring device 370 will be described. Also, it is assumed that the third optical device 340_3 is a light emitting device.

The monitoring device 370 is used to maintain a constant output of light emitting device. The monitoring device 370 detects an output of optical signal output from the third optical device 340_3. The monitoring device 370 may control outputs of the first, second and third optical devices 340_1, 340_2 and 340_3 according to the output of optical signal. For example, when an output of optical signal is weak, the monitoring device 370 may control the first, second and third optical devices 340_1, 340_2 and 340_3 so that outputs of the first, second and third optical devices 340_1, 340_2 and 340_3 are increased at the same time. When an output of optical signal is strong, the monitoring device 370 may control the first, second and third optical devices 340_1, 340_2 and 340_3 so that outputs of the first, second and third optical devices 340_1, 340_2 and 340_3 are decreased at the same time.

To perform the operations described above, the fourth filter 360_4 is required to transmit a part of optical signals from the third optical device 340_3 to the monitoring device 370. As described above, the monitoring device 370 monitors an output of optical device and thereby the optical device can stably output an optical signal.

According to the inventive concept, a platform such as an additional structure or a sub-mount for mounting an optical device is not needed and all the optical devices and electrical devices can be mounted on the same plane.

Figure 9:
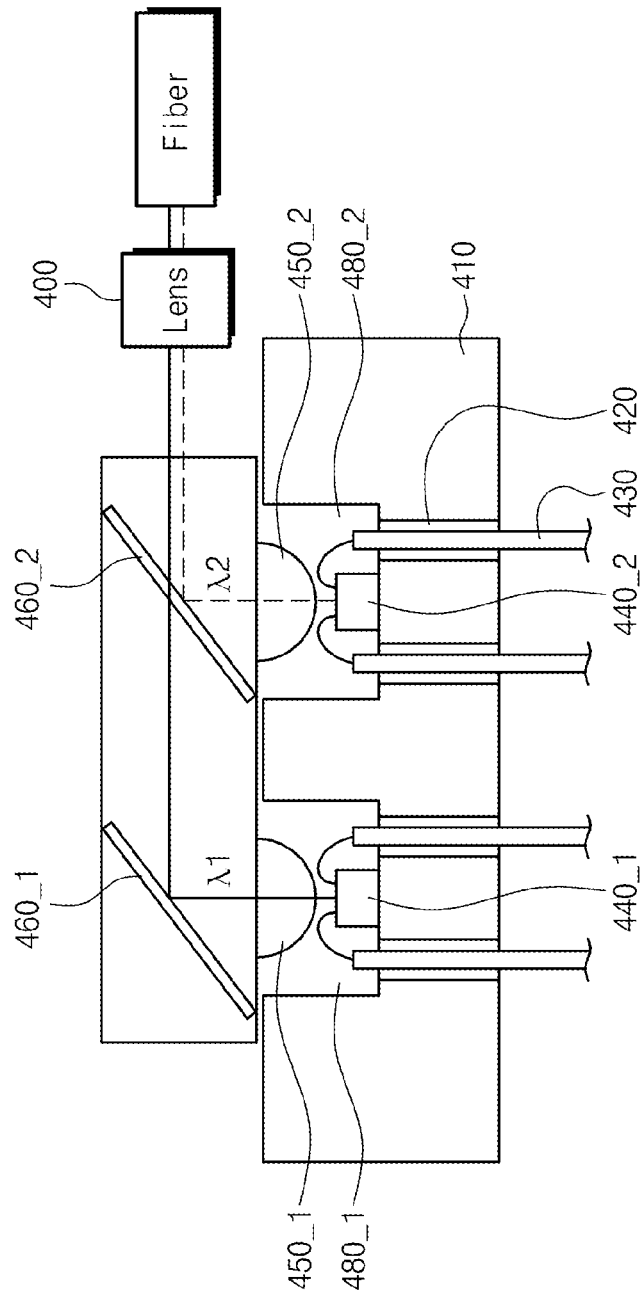

FIG. 9 is a drawing illustrating other embodiment of optical module in accordance with the inventive concept. Referring to FIG. 9, the optical module in accordance with the inventive concept includes a stem 410, an insulating layer 420, a lead 430, first and second optical devices 440-1 and 440_2, first and second lenses 450_1 and 450_2 and first and second filters 460_1 and 460_2. In the optical module, a lens 400 for collecting optical signals having a plurality of wavelengths being transmitted to an optical fiber may be additionally mounted.

In the present inventive concept, the two optical devices 440_1 and 440_2 are formed in cavities 480-1 and 480_2 inside the stem 410 respectively. One or more cavities may be formed in one stem to mount each of the optical devices. The optical device may be a light emitting device or a light receiving device. For example, one light emitting device and one light receiving device may be formed in the stem so that the optical module performs data transmission and data reception. Two light emitting devices may be formed in the stem so that the optical module performs data transmission using two wavelengths. Also, two light receiving devices may be formed in the stem so that the optical module performs data reception using two wavelengths.

The optical device is connected to the outside through the lead 430. The insulating layer 420 insulates the lead 430 and the stem 410. The lens transmits an optical signal from an optical fiber to a light receiving device or transmits an optical signal from a light emitting device to an optical fiber. For example, if the first optical device 440_1 is a light receiving device, the first lens 450_1 transmits an optical signal from an optical fiber to the first optical device 440_1. If the first optical device 440_1 is a light emitting device, the first lens 450_1 transmits an optical signal from the first optical device 440_1 to an optical fiber.

As an illustration, it is assumed that the first optical device 440_1 is a light receiving device and the second optical device 440_2 is a light emitting device. Among optical signals from an optical fiber, the second filter 460_2 passes an optical signal having a wavelength of $\lambda 1$ and reflects an optical signal having a wavelength of $\lambda 2$. The passed optical signal having a wavelength of $\lambda 1$ is reflected by the first filter 460_1. The optical signal having a wavelength of $\lambda 1$ reflected by the first filter 460_1 is transmitted to the first lens 450_1. The first lens 450_1 transmits the optical signal having a wavelength of $\lambda 1$ to the first optical device 440_1. The first optical device 440_1 converts the optical signal having a wavelength of $\lambda 1$ into an electrical signal. The converted electrical signal is transmitted to the outside through the lead 430.

The electrical signal from the lead 430 is converted an optical signal having a wavelength of $\lambda 2$. The optical signal having a wavelength of $\lambda 2$ is reflected by the second filter 460_2. The optical signal having a wavelength of $\lambda 2$ reflected by the second filter 460_2 is transmitted to an optical fiber. Consequently, the first optical device 440_1 receives an optical signal having a wavelength of $\lambda 1$ and the second optical device 440_2 transmits an optical signal having a wavelength of $\lambda 2$.

As described above, one stem 410 can perform data processing using two wavelengths by forming two optical devices 440_1 and 440_2 in one stem 410. That is, one optical module can process a plurality of optical wavelengths.

Figure 10:
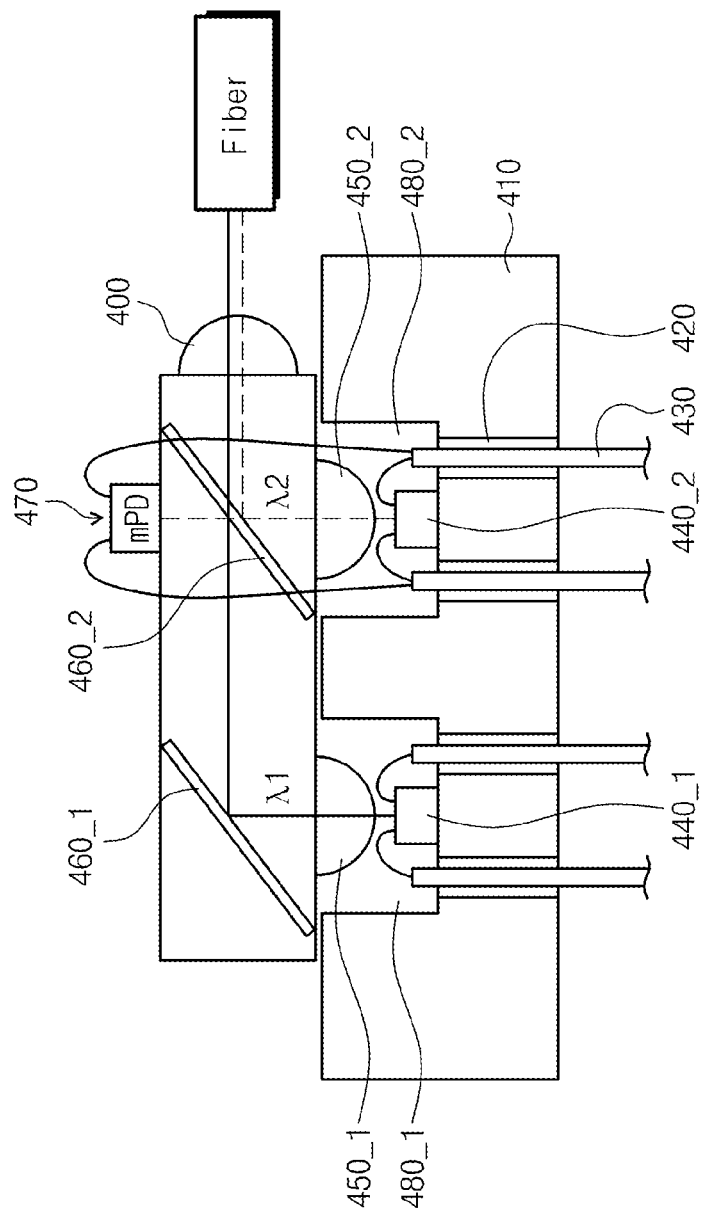

FIG. 10 is a drawing illustrating other embodiment of optical module in accordance with the inventive concept. Referring to FIG. 10, the optical module in accordance with the inventive concept includes a stem 410, an insulating layer 420, a lead 430, first and second optical devices 440-1 and 440_2, first and second lenses 450_1 and 450_2, first and second filters 460_1 and 460_2 and a monitoring device 470. In the optical module, a lens 400 for collecting optical signals having a plurality of wavelengths being transmitted to an optical fiber may be additionally mounted.

Operations of the elements except the monitoring device 470 were already described through FIG. 9. Thus, hereinafter, only an operation of the monitoring device 470 will be described. Also, it is assumed that the second optical device 440_2 is a light emitting device.

The monitoring device 470 is used to maintain a constant output of light emitting device. The monitoring device 470 detects an output of optical signal output from the second optical device 440_2. The monitoring device 470 may control outputs of the first and second optical devices 440_1 and 440_2 according to the output of optical signal. For example, when an output of optical signal is weak, the monitoring device 470 may control the first and second optical devices 440_1 and 440_2 so that outputs of the first and second optical devices 440_1 and 440_2 are increased at the same time. When an output of optical signal is strong, the monitoring device 470 may control the first and second optical devices 440_1 and 440_2 so that outputs of the first and second optical devices 440_1 and 440_2 are decreased at the same time.

To perform the operations described above, the second filter 460_2 is required to transmit a part of optical signals from the second optical device 440_2 to the monitoring device 470. As described above, the monitoring device 470 monitors an output of optical device and thereby the optical device can stably output an optical signal.

Figure 11:
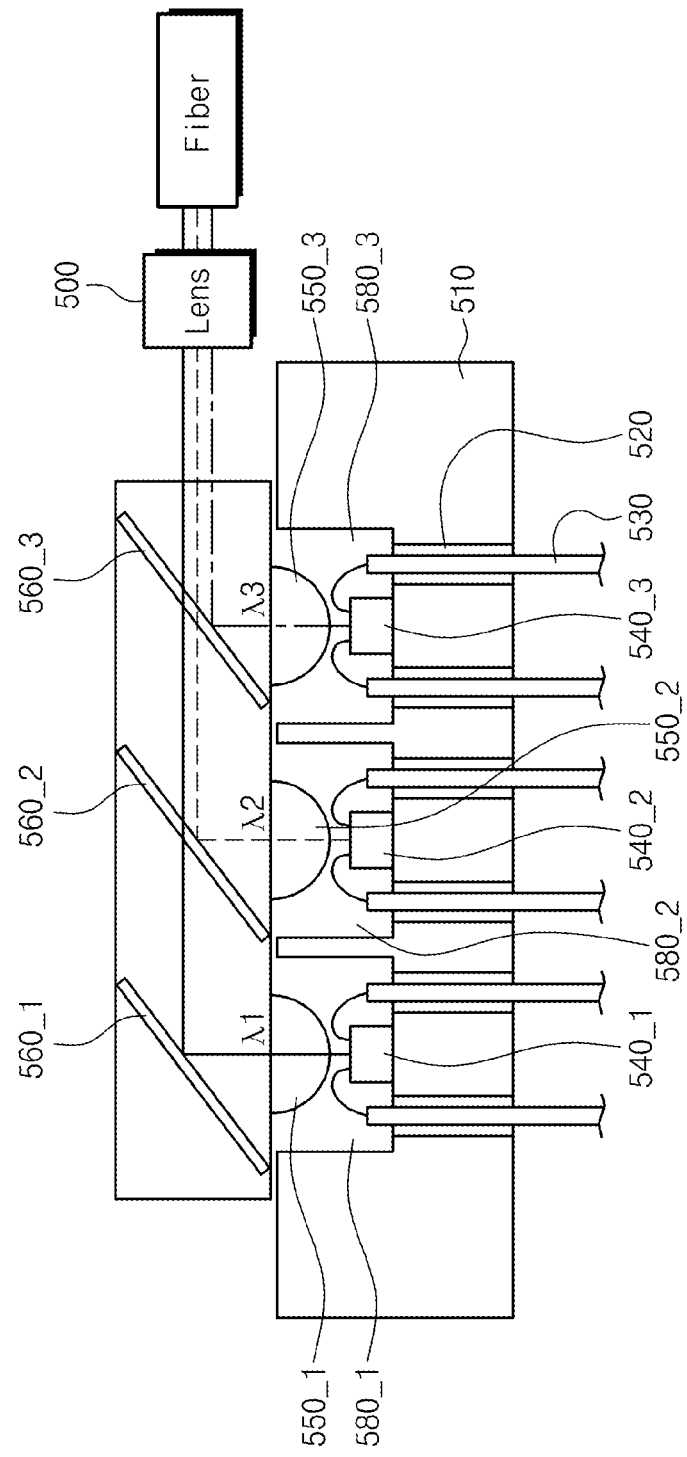

FIG. 11 is a drawing illustrating other embodiment of optical module in accordance with the inventive concept. Referring to FIG. 11, the optical module in accordance with the inventive concept includes a stem 510, an insulating layer 520, a lead 530, first through third optical devices 540-1~540_3, first through third lenses 550_1~550_3 and first through third filters 560_1~560_3. In the optical module, a lens 500 for collecting optical signals having a plurality of wavelengths being transmitted to an optical fiber may be additionally mounted.

In the present inventive concept, the three optical devices 540-1~540_3 are formed in cavities 580-1~580_3 inside the stem 510 respectively. One or more cavities may be formed in one stem to mount each of the optical devices. The optical device may be a light emitting device or a light receiving device. For example, two light emitting devices and one light receiving device may be formed in the cavities inside the stem so that the optical module performs two channel data transmission and one channel data reception. Three light emitting devices may be formed in the cavities inside the stem so that the optical module performs data transmission using three wavelengths.

The optical device is connected to the outside through the lead 530. The insulating layer 520 insulates the lead 530 and the stem 510. The lens transmits an optical signal from an optical fiber to a light receiving device or transmits an optical signal from a light emitting device to an optical fiber. For example, if the first optical device 540_1 is a light receiving device, the first lens 550_1 transmits an optical signal from an optical fiber to the first optical device 540_1. If the first optical device 540_1 is a light emitting device, the first lens 550_1 transmits an optical signal from the first optical device 540_1 to an optical fiber.

As an illustration, it is assumed that the first and second optical devices 540_1 and 540_2 are light receiving devices and the third optical device 540_3 is a light emitting device. An optical signal having a wavelength of $\lambda 1$ passes through the second and third filters 560_2 and 560_3 and is reflected by the first filter 560_1. The optical signal having a wavelength of $\lambda 1$ reflected by the first filter 560_1 is transmitted to the first lens 550_1. The first lens 550_1 transmits the optical signal having a wavelength of $\lambda 1$ to the first optical device 540_1. The first optical device 540_1 converts the optical signal having a wavelength of $\lambda 1$ into an electrical signal. The converted electrical signal is transmitted to the outside through the lead 530.

An optical signal having a wavelength of $\lambda 2$ passes through the third filter 560_3 and is reflected by the second filter 560_2. The optical signal having a wavelength of $\lambda 2$ reflected by the second filter 560_2 is transmitted to the second lens 550_2. The second lens 550_2 transmits the optical signal having a wavelength of $\lambda 2$ to the second optical device 540_2. The second optical device 540_2 converts the optical signal having a wavelength of $\lambda 2$ into an electrical signal. The converted electrical signal is transmitted to the outside.

The electrical signal from the lead 530 is converted into an optical signal having a wavelength of $\lambda 3$ by the third optical device 540_3. The optical signal having a wavelength of λ3 is reflected by the third filter 560_3. The optical signal having a wavelength of λ3 reflected by the third filter 560_3 is transmitted to an optical fiber. Consequently, the first optical device 540_1 receives an optical signal having a wavelength of λ1, the second optical device 540_2 receives an optical signal having a wavelength of λ2 and the third optical device 540_3 transmits an optical signal having a wavelength of λ3.

As described above, one stem 510 can perform data processing using three wavelengths by forming three optical devices 540_1~540_3 in one stem 510. That is, one optical module can process a plurality of optical wavelengths.

Figure 12:
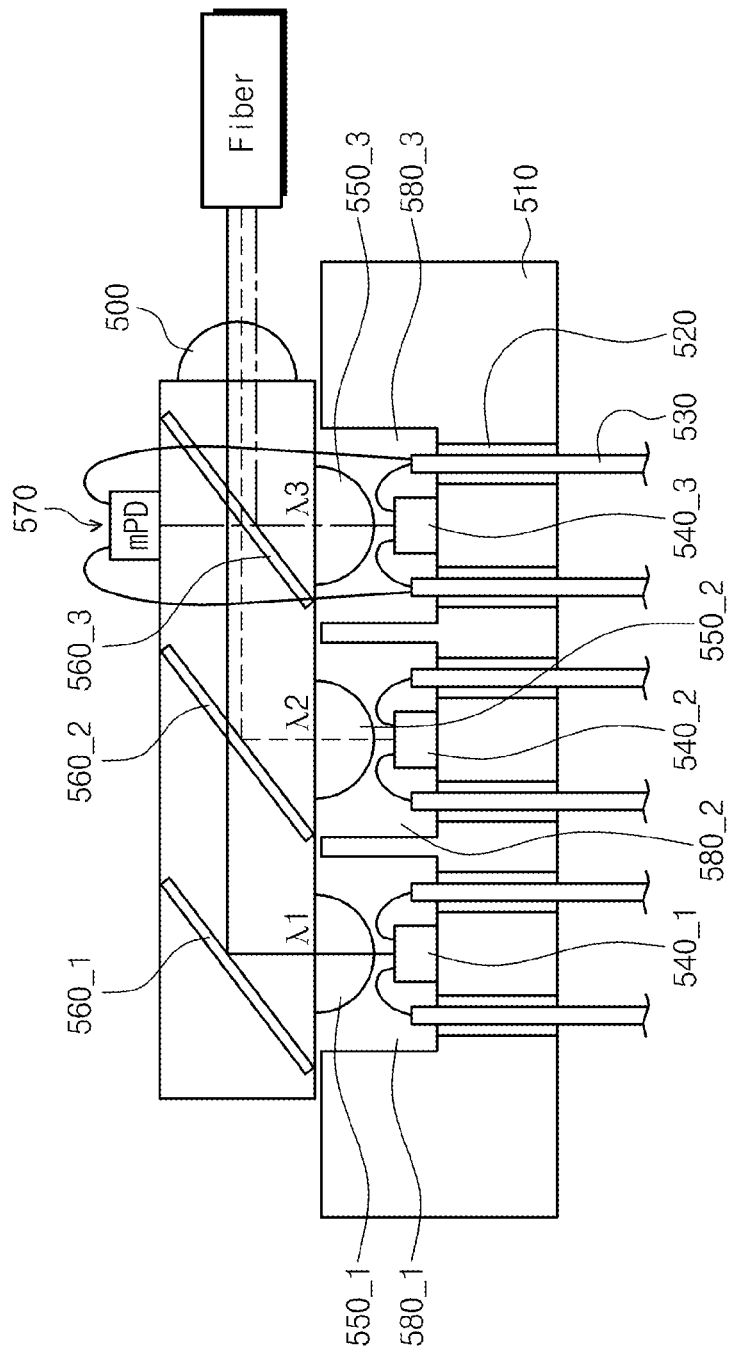

FIG. 12 is a drawing illustrating other embodiment of optical module in accordance with the inventive concept. Referring to FIG. 12, the optical module in accordance with the inventive concept includes a stem 510 in which one or more cavities 580_1, 580_2 and 580_3 are formed, an insulating layer 520, a lead 530, first through third optical devices 540-1~540_3, first through third lenses 550_1~550_3, first through third filters 560_1~560_3 and a monitoring device 570. In the optical module, a lens 500 for collecting optical signals having a plurality of wavelengths being transmitted to an optical fiber may be additionally mounted.

Operations of the elements except the monitoring device 570 were already described through FIG. 11. Thus, hereinafter, only an operation of the monitoring device 570 will be described. Also, it is assumed that the third optical device 540_3 is a light emitting device.

The monitoring device 570 is used to maintain a constant output of light emitting device. The monitoring device 570 detects an output of optical signal output from the third optical device 540_3. The monitoring device 570 may control outputs of the first through third optical devices 540_1~540_3 according to the output of optical signal. For example, when an output of optical signal is weak, the monitoring device 570 may control the first through third optical devices 540_1~540_3 so that outputs of the first through third optical devices 540_1~540_3 are increased. When an output of optical signal is strong, the monitoring device 570 may control the first through third optical devices 540_1~540_3 so that outputs of the first through third optical devices 540_1~540_3 are decreased.

To perform the operations described above, the third filter 560_3 is required to transmit a part of optical signals from the third optical device 540_3 to the monitoring device 570. As described above, the monitoring device 570 monitors an output of optical device and thereby the optical device can stably output an optical signal.

According to the inventive concept, a platform such as an additional structure or a sub-mount for mounting an optical device is not needed and all the optical devices and electrical devices can be mounted on the same plane.

Figure 13:
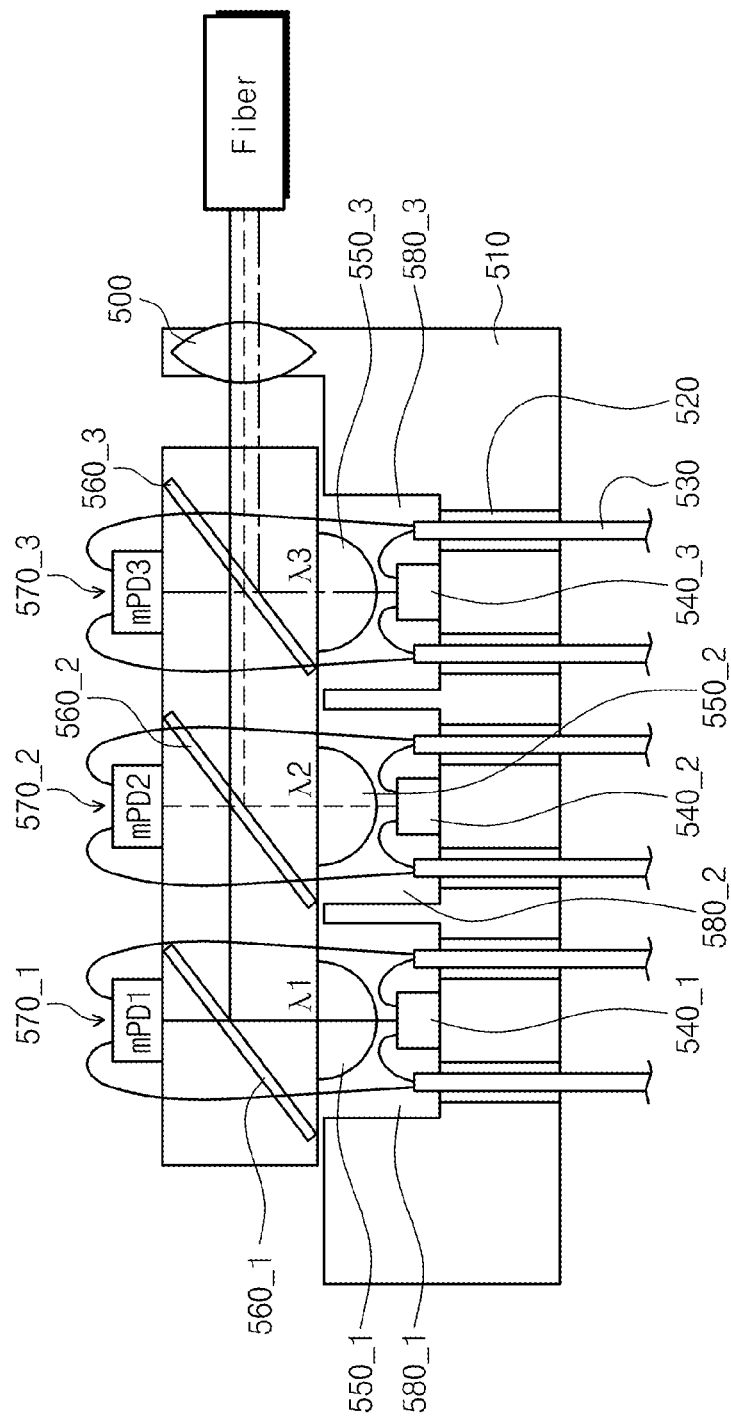

FIG. 13 is a drawing illustrating other embodiment of optical module in accordance with the inventive concept. Referring to FIG. 13, the optical module in accordance with the inventive concept includes a stem 510 in which one or more cavities 580_1, 580_2 and 580_3 are formed, an insulating layer 520, a lead 530, first through third optical devices 540-1~540_3, first through third lenses 550_1~550_3, first through third filters 560_1~560_3 and first through third monitoring devices 570_1~570_3. In the optical module, a lens 500 for collecting optical signals having a plurality of wavelengths being transmitted to an optical fiber may be additionally mounted.

Operations of the elements except the monitoring devices 570_1~570_3 were already described through FIG. 11. Thus, hereinafter, only an operation of the monitoring device 570 will be described. Also, it is assumed that the first through third optical device 540_1~540_3 is a light emitting device.

The monitoring devices 570_1~570_3 are used to maintain a constant output of light emitting device. The monitoring devices 570_1~570_3 detect an output of optical signal output from the first through third optical device 540_1~540_3. The first monitoring device 570_1 may control an output of the first optical device 540_1 according to the output of optical signal. For example, when an output of the first optical device 540_1 is weak, the first monitoring device 570_1 may control the first optical device 540_1 so that an output of the first optical device 540_1 is increased. When an output of the first optical device 540_1 is strong, the first monitoring device 570_1 may control the first optical device 540_1 so that an output of the first optical device 540_1 is decreased.

To perform the operations described above, the first through third filters 560_1~560_3 are required to transmit a part of optical signals from the optical device to the monitoring device. For example, the first filter 560_1 is required to transmit a part of optical signals from the first optical device 540_1. As described above, the monitoring device monitors an output of optical device and thereby the optical device can stably output an optical signal.

The lenses 200, 300, 400 and 500 illustrated in FIGS. 5 through 13 are not limited to a lens of a specific shape but may be a lens of various shapes such as a hemisphere lens, a spherical lens, an aspheric lens or the like.

According to the inventive concept, a platform such as an additional structure or a sub-mount for mounting an optical device is not needed and all the optical devices and electrical devices can be mounted on the same plane.

Figure 14:
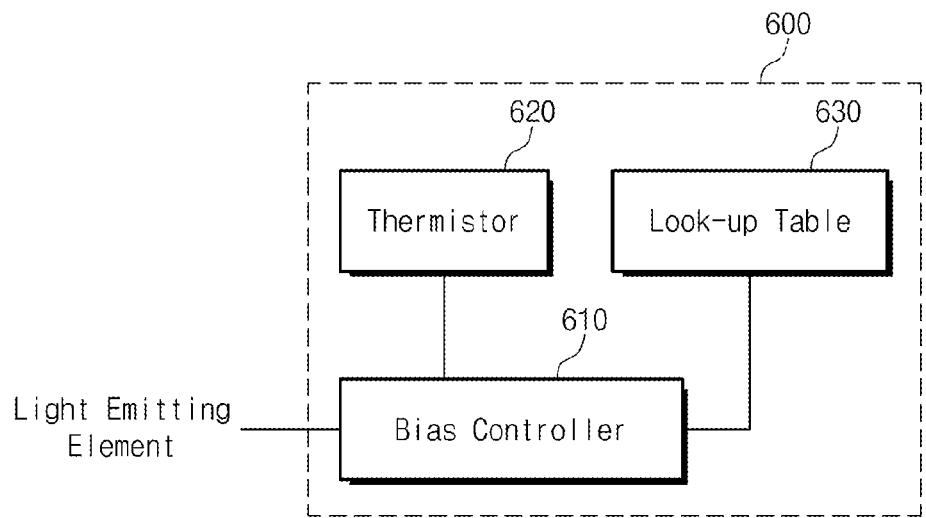
FIGS. 14 and 15 are block diagrams illustrating some other embodiments of monitoring device of optical module in accordance with the inventive concept.

FIG. 14 is a block diagram illustrating other embodiment of monitoring device of the optical module in accordance with the inventive concept. Referring to FIG. 14, the monitoring device 600 includes a bias controller 610, a thermistor 620 and a look-up table 630.

A resistance of the thermistor 620 varies depending on the temperature. As a temperature increases, a resistance of positive characteristic thermistor increases and a resistance of negative characteristic thermistor decreases. Magnitude of bias depending on a resistance of the thermistor 620 is stored in the look-up table 630. The bias controller 610 controls a bias voltage of a light emitting device with reference to a resistance of the thermistor 620 and the look-up table 630. For example, the bias controller 610 can increase a bias current of a light emitting device when a resistance of positive characteristic thermistor increases. Also, the bias controller 610 can reduce a bias current of a light emitting device when a resistance of positive characteristic thermistor decreases.

As described above, an optical device can stably output an optical signal by changing a bias of optical device depending on the temperature.

Figure 15:
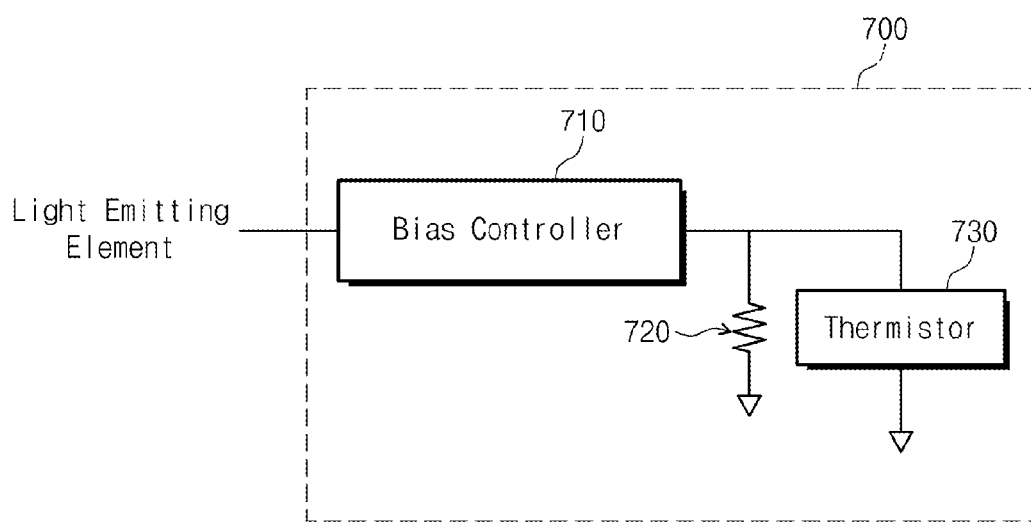

FIG. 15 is a block diagram illustrating other embodiment of monitoring device of the optical module in accordance with the inventive concept. Referring to FIG. 15, the monitoring device 700 includes a bias controller 710, a fixed resistor 720 and a thermistor 730.

A resistance of the thermistor 730 varies depending to the temperature. The thermistor 730 and the fixed resistor 720 are connected to each other in parallel. As a resistance of the thermistor 730 varies, the whole parallel resistance varies. For example, if a resistance of positive characteristic thermistor increases, the whole parallel resistance increases and if a resistance of positive characteristic thermistor decreases, the whole parallel resistance decreases. The bias controller 710 controls a bias current of a light emitting device with reference to the whole parallel resistance. For example, if the whole parallel resistance increases, the bias controller 710 may increase a bias current of a light emitting device and if the whole parallel resistance decreases, the bias controller 710 may decrease a bias current of a light emitting device.

As described above, an optical device can stably output an optical signal by changing a bias of optical device depending on the temperature.

According to the inventive concept, processing capacity of optical module may be improved. Also, according to the inventive concept, electrical and optical cross talk of the optical module may be reduced.

Although the present inventive concept has been described in connection with the embodiments of the present inventive concept illustrated in the accompanying drawings, it is not limited thereto will be apparent to those skilled in the art that various substitutions, modifications and changes may be made thereto without departing from the scope and spirit of the inventive concept.

What is claimed is:

1. A multi-channel optical module comprising:
    a stem including one or more cavities;
    at least one lead pin formed in one or more cavities;
    a plurality of optical devices formed in the one or more cavities,
    wherein a plurality of diameters of a plurality of lenses are controlled, and
    wherein at least one height in the one or more cavities is controlled; and
    at least one filter forming an optical path between the plurality of optical devices and an optical fiber by separating a plurality of optical signals according to a wavelength,
    wherein one or more monitoring devices are disposed on a lens block and the at least one filter.

2. The multi-channel optical module of claim 1, wherein the one or more monitoring devices being disposed above at least one of the optical devices, measure a strength of optical signal output from at least one of the optical devices and control outputs of the optical devices depending on the measurement result.

3. The multi-channel optical module of claim 2, wherein the monitoring device comprises:
    a thermistor of which a resister is changed depending on the temperature;
    a look-up table storing magnitude of bias according to a resistance of the thermistor; and
    a bias controller controlling a bias current of each of the optical devices with reference to a resistance of the thermistor and the look-up table.

4. The multi-channel optical module of claim 3, wherein the bias controller increases or decreases a bias current of each of the optical devices as a resistance of the thermistor increases.

5. The multi-channel optical module of claim 3, wherein the bias controller decreases or increases a bias current of each of the optical devices as a resistance of the thermistor decreases.

6. The multi-channel optical module of claim 2, wherein the monitoring device comprises:
    a thermistor of which a resistance varies depending on the temperature;
    a fixed resistor having a constant resistance regardless of the temperature, the fixed resistor being connected to the thermistor in parallel; and
    a bias controller controlling a bias current of each of the optical, devices with reference to the whole parallel resistance of the thermistor and the fixed resistor.

7. The multi-channel optical module of claim 6, wherein the bias controller increases or decreases a bias current of each of the optical devices as the whole parallel resistance increases.

8. The multi-channel optical module of claim 6, wherein the bias controller decreases or increases a bias current of each of the optical devices as the whole parallel resistance decreases.

9. The multi-channel optical module of claim 1, wherein the filter comprises:
    a first filter being disposed above an upper portion of a first optical device, passing an optical signal having a first wavelength to form an optical path between the first optical device and the optical fiber and reflecting an optical signal having a second wavelength; and
    a second filter being disposed above an upper portion of a second optical device and reflecting the optical signal having the second wavelength reflected by the first filter to form an optical path between the second optical device and the optical fiber.

10. The multi-channel optical module of claim 9, wherein the one or more monitoring devices being disposed above an upper portion of the first optical device or the second optical device, measure a strength of optical signal output from the first optical device or the second optical device and control an output of the first optical device or the second optical device depending on the measurement result.

11. The multi-channel optical module of claim 1, wherein the filter comprises:
    a first filter being disposed above an upper portion of a first optical device and reflecting an optical signal having a first wavelength to form an optical path between the first optical device and the optical fiber; and
    a second filter being disposed above an upper portion of a second optical device and forming an optical path between the second optical device and the optical fiber by passing the optical signal having the first wavelength and reflecting an optical signal having a second wavelength.

12. The multi-channel optical module of claim 11, wherein the one or more monitoring devices being disposed above an upper portion of at least one of the first optical device and the second optical device, measure a strength of optical signal output from at least one of the first optical device and the second optical device and control outputs of the first optical device and the second optical device depending on the measurement result.

13. The multi-channel optical module of claim 1, wherein the filter comprises:
    a first filter being disposed above an upper portion of a second optical device, and reflecting an optical signal having a first wavelength and passing optical signals having a second wavelength and a third wavelength among optical signals from the upper portion of the second optical device;
    a second filter being disposed above an upper portion of the first optical device and on a side of the first filter and reflecting the optical signal having the first wavelength reflected by the first filter to form an optical path between the first optical device and the optical fiber;
    a third filter being disposed above an upper portion of the second optical device and on a lower portion of the first filter, passing the optical signal having the second wavelength passed through the first filter to form an optical path between the second optical device and the optical fiber and reflecting an optical signal having a third wavelength; and a fourth filter being disposed above an upper portion of a third optical device and on a side of the third filter and reflecting the optical signal having the third wavelength reflected by the third filter to form an optical path between the third optical device and the optical fiber.

14. The multi-channel optical module of claim 13, wherein the one or more monitoring devices being disposed above an upper portion of at least one of the first through third optical devices, measure a strength of optical signal output from at least one of the first through third optical devices and control outputs of the first through third optical devices depending on the measurement result.

15. The multi-channel optical module of claim 1, wherein the filter comprises:
 a first filter being disposed above an upper portion of a first optical device and reflecting an optical signal having a first wavelength to form an optical path between the first optical device and the optical fiber;
 a second filter being disposed above an upper portion of a second optical device and forming an optical path between the second optical device and the optical fiber by passing the optical signal having the first wavelength and reflecting an optical signal having a second wavelength; and
 a third filter being disposed above an upper portion of a third optical device and forming an optical path between the third optical device and the optical fiber by passing the optical signal having the first wavelength and the second optical signal having the second wavelength and reflecting an optical signal having a third wavelength.

16. The multi-channel optical module of claim 15, wherein the one or more monitoring devices being disposed above an upper portion of at least one of the first through third optical devices, measure a strength of optical signal output from at least one of the first through third optical devices and control outputs of the first through third optical devices depending on the measurement result.

17. The multi-channel optical module of claim 1, further comprising a lens for collecting the plurality of optical signals, the lens being disposed between the optical fiber and the filter.

18. The multi-channel optical module of claim 1, further comprising at least one supplemental lens being attached on a lower portion of the filter for a radiation angle of optical signals, or focusing the optical signals.

19. The multi-channel optical module of claim 1, wherein heights of each of the cavities are different for minimizing a difference of the optical paths of the plurality of optical signals.

20. The multi-channel optical module of claim 1, further comprising a metal reflect coating for reducing electrical or optical cross talk disposed except portions which the optical signals passes by.

* * * * *